(12) United States Patent
Jwa (10) Patent No.: US 6,969,653 B2
(45) Date of Patent: Nov. 29, 2005

(54) METHODS OF MANUFACTURING AND-TYPE FLASH MEMORY DEVICES

(75) Inventor: Seung Hee Jwa, Gyeonggi-do (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 0 days.

(21) Appl. No.: 10/749,489

(22) Filed: Dec. 30, 2003

(65) Prior Publication Data

US 2004/0152264 A1    Aug. 5, 2004

(30) Foreign Application Priority Data

Dec. 30, 2002  (KR) .................... 10-2002-0087291

(51) Int. Cl.⁷ .......................................... H01L 21/336
(52) U.S. Cl. ..................... 438/260; 257/341
(58) Field of Search ........ 257/301–315; 438/257–267, 438/593, 594

(56) References Cited

U.S. PATENT DOCUMENTS

| | | | |
|---|---|---|---|
| 6,153,494 A | 11/2000 | Hsieh et al. | ............... 438/424 |
| 6,326,263 B1 | 12/2001 | Hsieh | ...................... 438/257 |
| 6,566,195 B2 | 5/2003 | Rudeck | ..................... 438/257 |
| 6,724,036 B1 * | 4/2004 | Hsieh et al. | ............... 257/316 |

* cited by examiner

Primary Examiner—David Nelms
Assistant Examiner—Calvin Lee
(74) Attorney, Agent, or Firm—Hanley, Flight & Zimmerman (57) ABSTRACT

Example methods of manufacturing an AND-type flash memory device are disclosed. One example method may include forming a tunnel oxide layer and a first polysilicon layer in sequence on a silicon substrate; forming a floating gate by removing some part of the first polysilicon layer; forming a source/drain region at both sides of the floating gate by implanting ions into the substrate; forming spacers on sidewalls of the floating gate; depositing a sacrificial layer on the resulting substrate; exposing some part of the substrate and the floating gate; forming a first trench on the exposed part of the substrate and a second trench on the exposed part of the floating gate; depositing an oxide layer to fill the first and second trenches with the oxide layer; removing the oxide layer and the sacrificial layer through a fourth etching process until the floating gate is exposed; removing the spacers and the remaining sacrificial layer to form the floating gate with the second trench and a trench-type device isolation layer; and depositing a gate insulating layer and a second polysilicon layer to form a control gate in sequence on the resulting substrate.

8 Claims, 7 Drawing Sheets

Fig. 1

-- Prior Art --

Fig. 2

-- Prior Art --

Fig. 3

-- Prior Art --

METHODS OF MANUFACTURING AND-TYPE FLASH MEMORY DEVICES

TECHNICAL FIELD

The present disclosure relates to memory devices and, more particularly, to methods of manufacturing AND-type flash memory devices.

BACKGROUND

With development of high-capacity memory devices, nonvolatile memory devices are becoming increasingly important. An example of the nonvolatile memory device is a flash memory device. The flash memory devices can preserve information stored in a memory cells even without power being supplied to the device. Additionally, information can be erased from the flash memory at high-speed.

As an example, U.S. Pat. No. 6,566,195 to Rudeck provides a method and a structure for an improved floating gate memory cell. The nonvolatile memory cell by the Rudeck patent includes a first insulating layer formed on a substrate; a shallow trench isolation (STI) region having walls that form edges in the substrate and edges to a first conducting layer where the edges of the first conducting layer are aligned with the edges of the substrate; a second insulating layer formed on the first conducting layer; and a second conducting layer formed on the first insulating layer.

In the field of flash memory technology development, memory cell structure has been continuously improved in various ways. Examples of such improved cell structures include a stack gate cell, a split gate cell, a source side injection cell, etc. Particularly, the stack gate cell has a multi-layer structure that a floating gate and a control gate are stacked in sequence. In the stack gate cell, a source/drain region is formed by channel hot electron injection(CHEI) and a program operation is performed in the drain side and an erase operation is performed through Follower-Nordheim tunneling in the source side. The stack gate cell is very small in size and, therefore, is largely used as a unit cell of flash memory devices.

A cell array is an important factor determining a type of a flash memory device together with a memory device structure, an erasing method, and a programming method. Among various cell array structures, an AND-type cell array can embody the densification and the high-performance operation of a flash memory.

Figure 1:
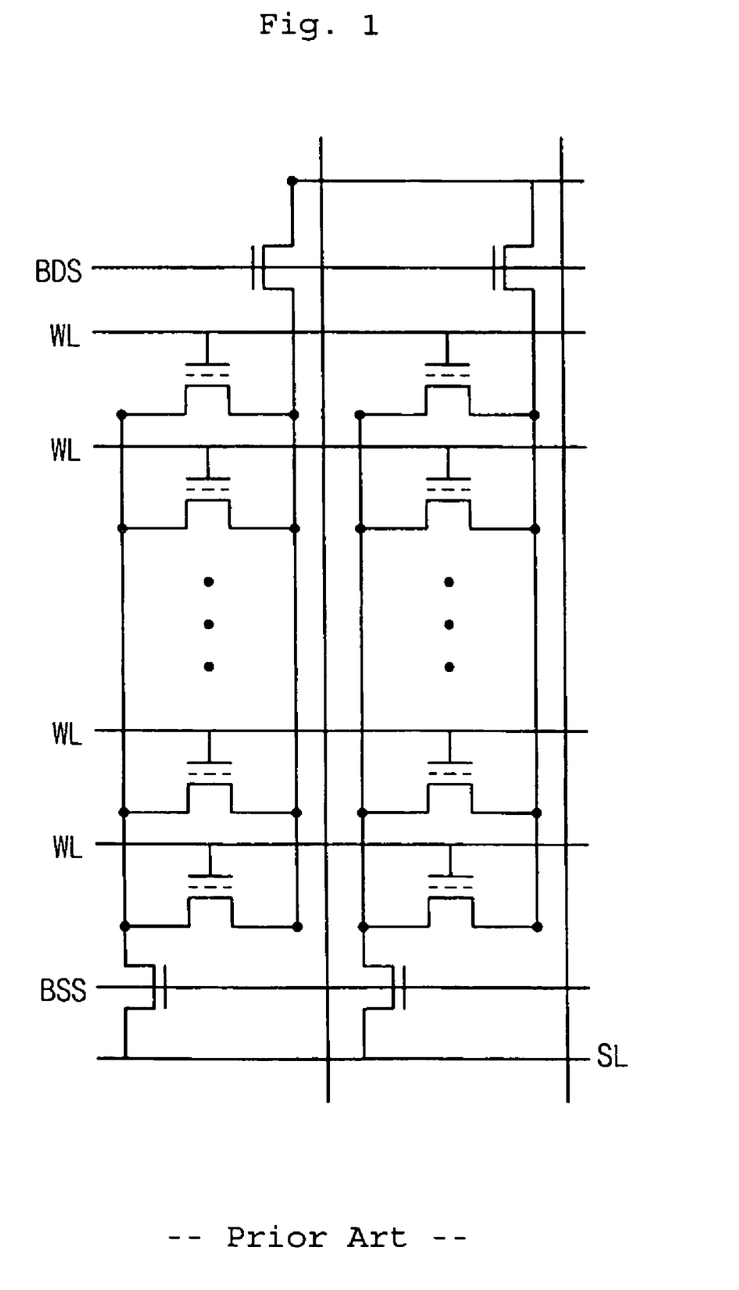
FIG. 1 is a schematic diagram illustrating cell array of a conventional AND-type flash memory device.
Figure 2:
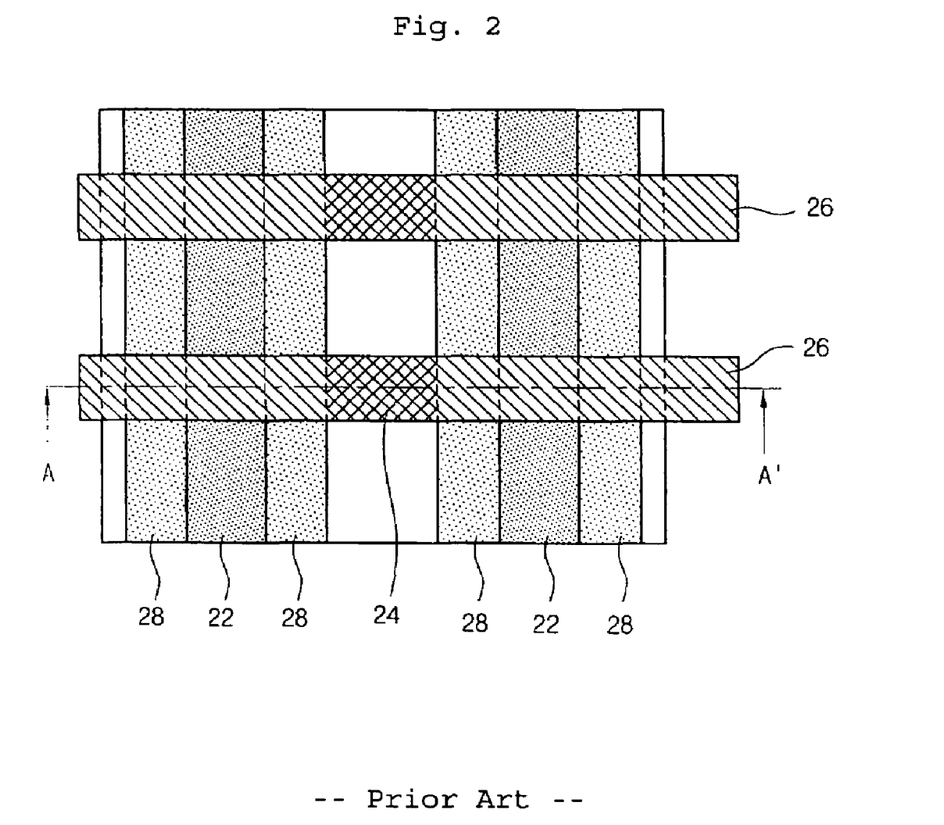
FIG. 2 shows a layout of the flash memory device of FIG. 1.
Figure 3:
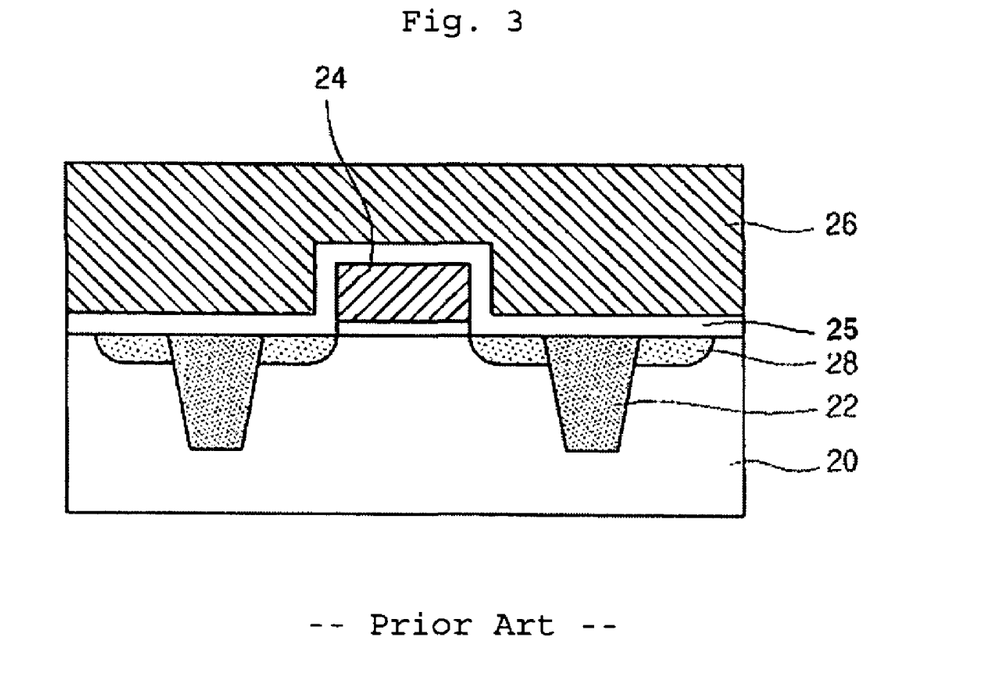
FIG. 3 is a cross-sectional view of FIG. 2 taken along a line A–A'.

FIG. 1 is a schematic diagram illustrating cell array of a conventional AND-type flash memory device. FIG. 2 shows a layout of the flash memory device of FIG. 1. FIG. 3 is a cross-sectional view of FIG. 2 taken along a line A–A'.

Referring to FIGS. 1 through 3, in an AND-type flash memory device, a floating gate 24 and a control gate 26 are layered on a substrate 20 including a device isolation layer 22 and a source/drain region 28 is formed at both sides of the floating gate 24 in the substrate 24. A thin tunnel oxide 23 is formed between the substrate 20 and the floating gate 24 and a gate oxide 25 is formed between the floating gate 24 and the control gate 26. Such an AND-type flash memory device embodies densification by sharing bit line contacts and source lines in a plurality of cells and suppresses the occurrence of disturb during program operation through parallel connection and the layered bit lines and source lines.

However, a conventional AND-type flash memory device has a high density of interconnection in a diffusion layer and, in particular, has a low coupling ratio due to the reduction of cell size according to high-integration. Such a low coupling ratio may cause an increase in internal voltage within the AND-type flash memory device.

As a conventional method of increasing the coupling ratio in fabricating a flash memory cell, U.S. Pat. No. 6,153,494 to Hsieh et al. provides a method for forming a stacked-gate flash memory cell having a shallow trench isolation with a high-step of oxide and high lateral coupling. The method disclosed in the Hsieh et al. patent comprises depositing a high or thick layer of nitride; forming a shallow trench isolation (STI) through the nitride layer into the substrate; filling the STI with isolation oxide; removing the nitride thus leaving behind a deep opening about the filled STI; filling conformally the opening with a first polysilicon layer to form a floating gate; forming interpoly oxide layer over the floating gate; forming a second polysilicon layer to form the control gate; and forming the self-aligned source of the stacked-gate flash memory cell.

As another example, U.S. Pat. No. 6,326,263 to Hsieh discloses a method of fabricating a flash memory cell having a self-aligned floating gate structure and an enhanced coupling ratio characteristic. The method disclosed in the Hsieh patent comprises providing a substrate having a tunneling oxide layer, a defined first polysilicon layer, and a sacrificial layer defining an active region; performing an etching process using the sacrificial layer as a mask to form a STI pattern; forming a dielectric layer that fills the STI pattern; performing a planarization process to remove the dielectric layer over the sacrificial layer; performing a first etch back process to remove a pre-selected thickness of the dielectric layer over the STI pattern; forming a second polysilicon layer; performing a second etch back process to form a spacer connecting with the first polysilicon layer; removing the sacrificial layer; forming an insulating layer on the surface of the spacer and the first polysilicon layer; forming a control gate on the insulating layer; and performing an ion implantation process to form a source and a drain on the substrate within the active region.

DETAILED DESCRIPTION

Figure 4A:
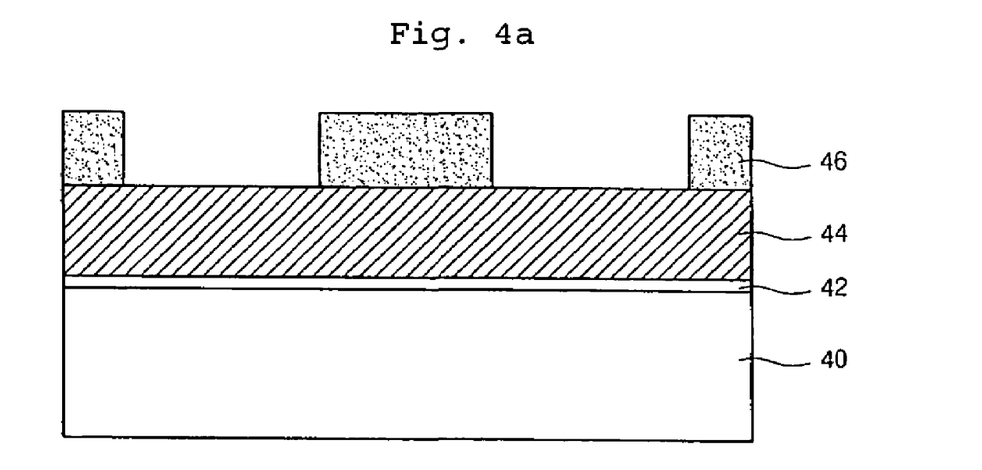
FIGS. 4a through 4i illustrate, in cross-sectional views, the results of process steps of an example method of manufacturing an AND-type flash memory device as disclosed herein.

Referring to FIG. 4a, a tunnel oxide layer 42 and a first polysilicon layer 44 are deposited in sequence on a silicon substrate 40. The first polysilicon layer 44 is formed more thickly than a device isolation layer in a following process. In detail, the first polysilicon layer is at least 300 Å and may be between 300 Å and 2500 Å thicker than the device isolation layer. The thickness of the first polysilicon layer 44 is adjusted according to the amount of the polysilicon etched in the following process. The above-mentioned thickness of the first polysilicon layer 44 is required when the etching selectivity of the first polysilicon layer 44 to the silicon substrate 40 is 1:1. The thickness of the first polysilicon layer 44 can be adjusted according to the etching selectivity.

Next, a first photoresist pattern 46 is formed on the first polysilicon layer 44. The first photoresist pattern 46 defines a source/drain region and a device isolation area on the substrate 40.

Figure 4B:
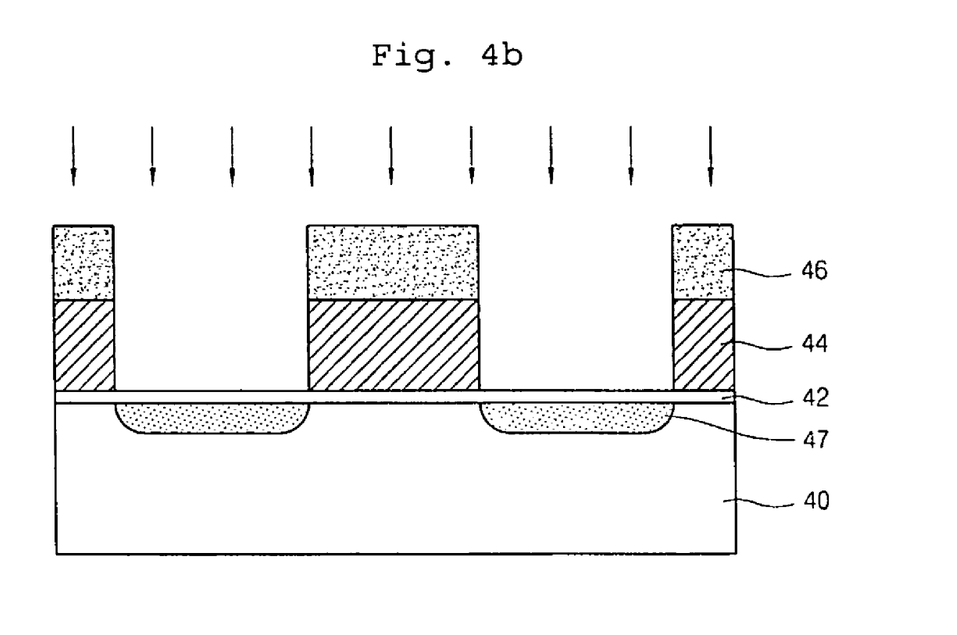

Referring to FIG. 4b, a first etching process is performed using the photoresist pattern 46 as a mask until the tunnel oxide layer 42 is exposed. As a result, a floating gate 45 is formed. Then, an ion implantation process is performed to implant ions into the resulting substrate and an annealing process is performed. The ion implanted may be, for example, As or P. As a result, a source/drain region 47 is formed at both sides of the floating gate 45 in the substrate. Here, the exposed tunnel oxide layer 42 prevents the substrate 40 from being damaged during the ion implantation.

Figure 4C:
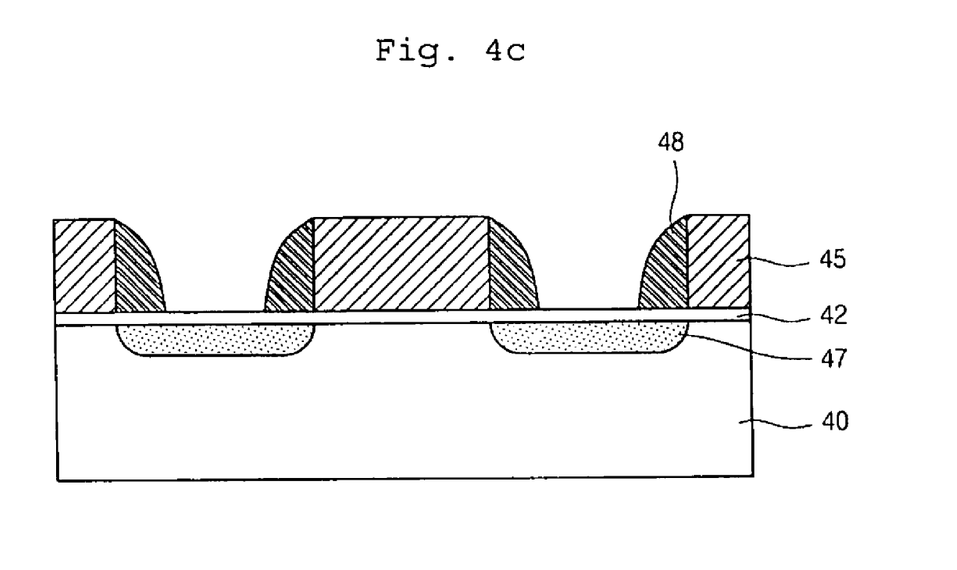

Referring to FIG. 4c, the first photoresist layer 46 is removed. A first sacrificial layer is deposited over the substrate 40 including the floating gate. The first sacrificial layer may be formed of nitride. Then, a first etch back process is performed without a mask to form spacers 48 on the sidewalls of the floating gate 45. The first etch back process may be performed through a dry etching and an anisotropic etching. The spacers have an open sidewall inclined gently and, therefore, a filling material is fully deposited without creating voids in a filling process of trenches.

Figure 4D:
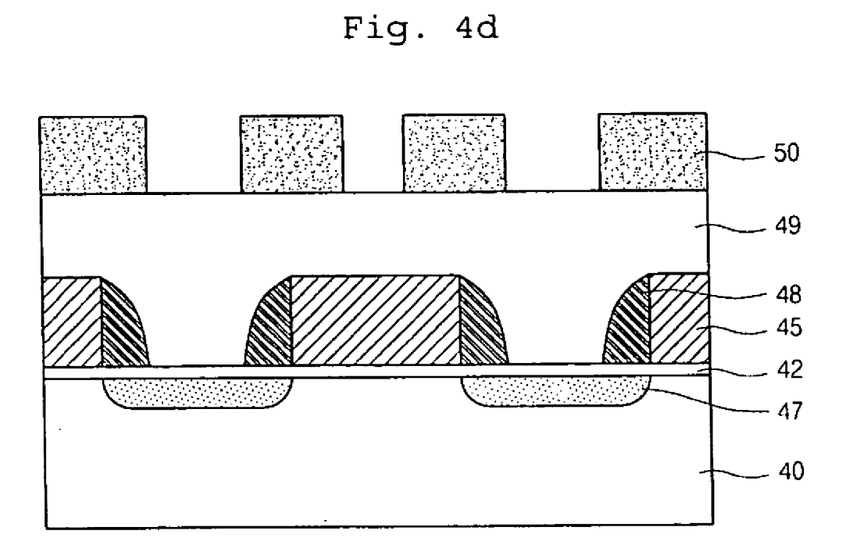

Referring to FIG. 4d, a second sacrificial layer 49 is deposited over the substrate 40 including the floating gate 45 and the spacers 48. The second sacrificial layer 49 may be formed of one of TEOS oxides, BPSG, and HDP oxides. Therefore, the spacers 48 have a high etching selectivity to the second sacrificial layer 49 and, in the following process, a self-aligned trench can be formed even in case of mask misalignment. Next, a second photoresist pattern 50 is formed on the second sacrificial layer 49. Through the second photoresist pattern 50, some part of the floating gate 45 and an area for device isolation are exposed.

Figure 4E:
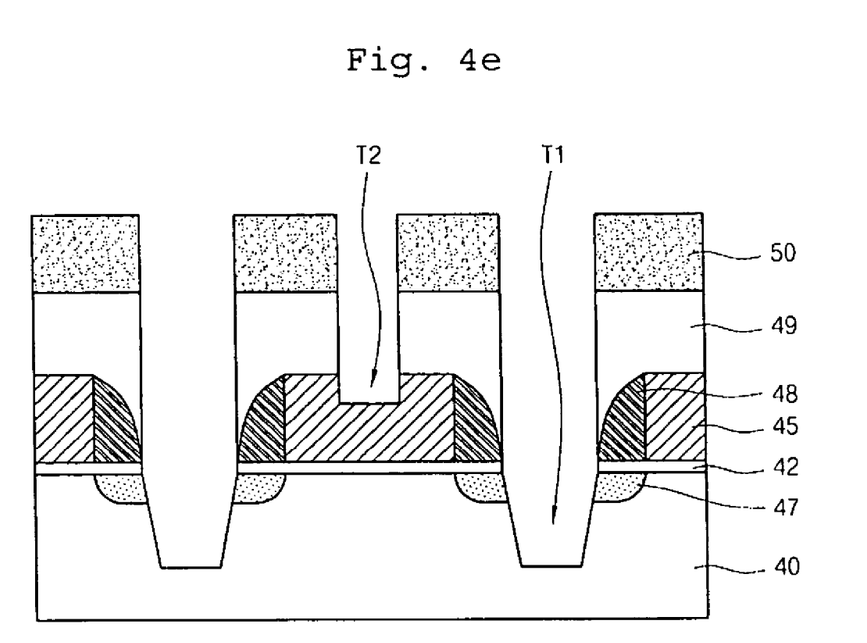

Referring to FIG. 4e, some parts of the second sacrificial layer 49 and the tunnel oxide layer 42 are removed through a second etching process using the second photoresist pattern 50 as a mask. As a result, some part of the substrate 40 and the floating gate 45 are exposed. Next, the exposed part of the substrate 40 is etched to a predetermined depth to form a first trench T1 and the exposed part of the floating gate 45 is etched to a predetermined depth to form a second trench T2. Here, the self-aligned trench T2 can be formed on a desired place although mask misalignment occurs at a previous step because the spacers 48 have a high etching selectivity to the second sacrificial layer 49.

Figure 4F:
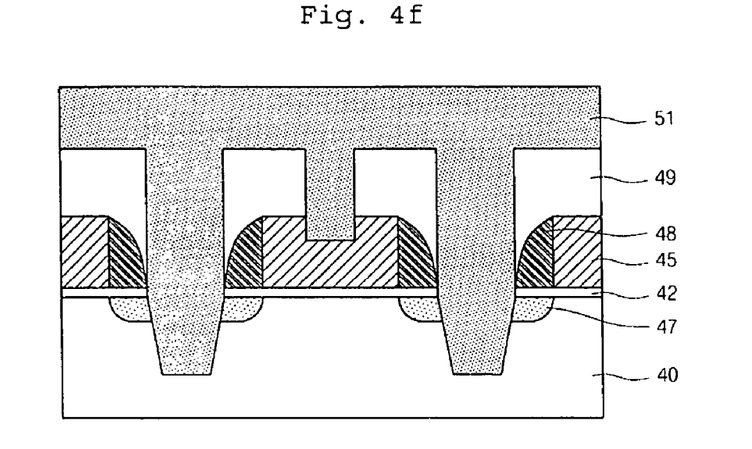

Referring to FIG. 4f, the second photoresist pattern is removed. Then, an oxide layer 51 is deposited over the resulting substrate to fill completely the first trench T1 and the second trench T2.

Figure 4G:
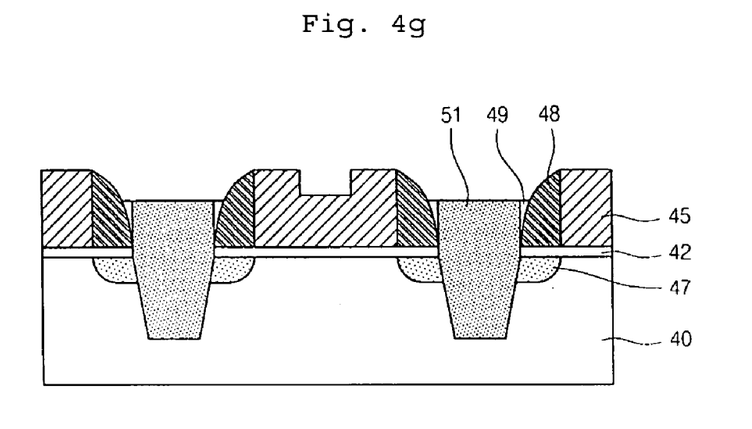

Referring to FIG. 4g, a chemical mechanical polishing (CMP) process or an etch back process is performed to remove the oxide layer 51 and the second sacrificial layer 49 until the floating gate 45 is exposed.

Figure 4H:
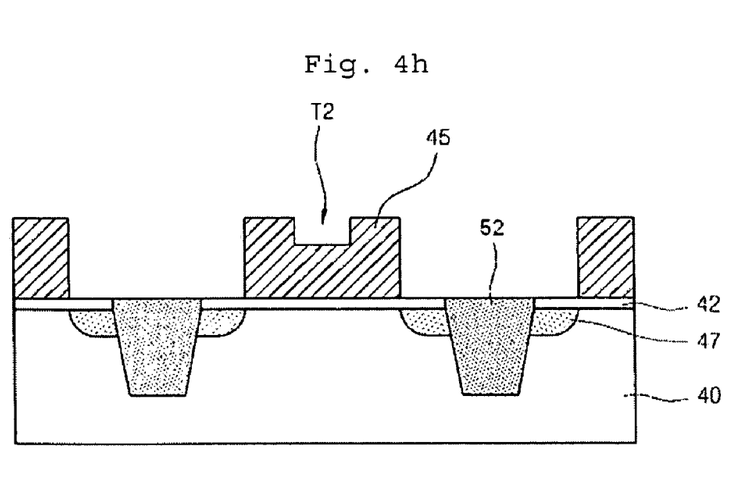

Referring to FIG. 4h, the spacers are removed through a dry etching process using phosphoric acid at a temperature higher than, for example, 70° C. and, at the same time, the remaining second sacrificial layer is completely removed. As a result, a trench-type device isolation layer 52 and a floating gate with the second trench T2 are formed on the substrate 40.

Figure 4I:
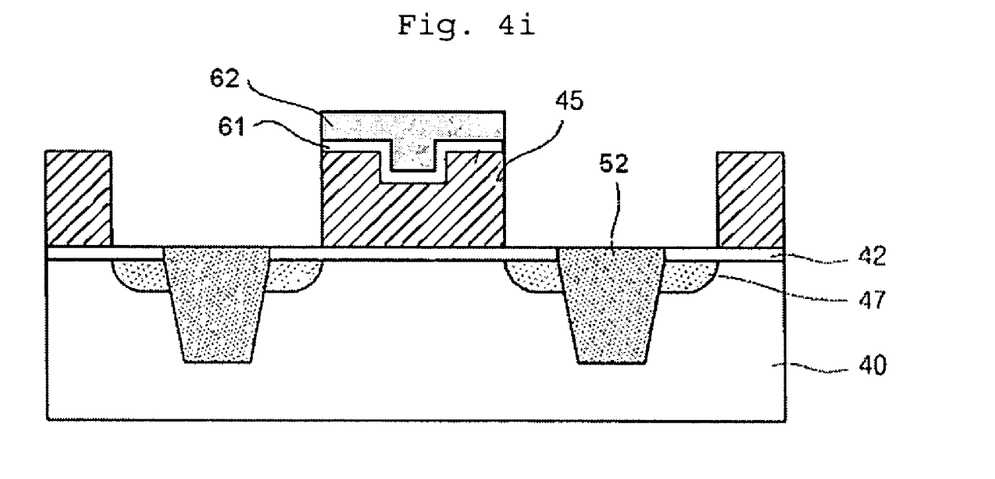

Referring to FIG. 4i, an insulating layer is deposited over the floating gate 45 with the second trench and, then, a second polysilicon layer is deposited on the insulating layer. The insulating layer may be a single layer formed of oxide or a multi-layer of oxide-nitride-oxide (ONO). Next, a gate insulating layer 61 and a control gate 62 are formed through a patterning process for the insulating layer and the second polysilicon layer and an AND-type flash memory device is completed.

As disclosed herein, an AND-type flash memory device has a broader contact surface area between a floating gate and a control gate than a conventional flash memory device due to a trench formed on the floating gate, thereby providing a high coupling ratio. Therefore, the devices constructed as disclosed herein can improve device characteristics and reliability by preventing the increase of internal voltage due to a low coupling ratio. Additionally, the coupling ratio on such devices may be improved without increase of cell size by forming a trench on a floating gate, thereby improving device characteristics and reliability.

In addition, the disclosed example methods may be used to stably form a self-aligned floating gate, a source/drain region, and a device isolation layer, achieving high-integration. Further, the disclosed example methods can reduce manufacturing costs because they can omit some processes using Deep ultra-violet (DUV) by unifying a mask process for the formation of a device isolation layer and another mask process for the formation of a trench on a floating gate.

As will be appreciated by the foregoing, disclosed herein are example methods of manufacturing an AND-type flash memory device. The disclosed example methods can prevent the decrease of coupling ratio due to high-integration. According to one disclosed example method, a method for manufacturing AND-type flash memory devices includes forming a tunnel oxide layer and a first polysilicon layer in sequence on a silicon substrate; forming a floating gate by removing some part of the first polysilicon layer using a first etching process; forming a source/drain region at both sides of the floating gate by implanting ions into the substrate including the floating gate; and forming spacers on the sidewalls of the floating gate. The example method may also include depositing a sacrificial layer on the resulting substrate; exposing some part of the substrate and the floating gate by removing some part of the sacrificial layer and the tunnel oxide layer through a second etching process; forming a first trench on the exposed part of the substrate and a second trench on the exposed part of the floating gate through a third etching process; and depositing an oxide layer to fill the first and second trenches with a oxide layer. The example method may further include removing the oxide layer and the sacrificial layer through a fourth etching process until the floating gate is exposed; removing the spacers and the remaining sacrificial layer to form the floating gate with the second trench and a trench-type device isolation layer; and depositing a gate insulating layer and a second polysilicon layer to form a control gate in sequence on the resulting substrate.

In some methods, the first polysilicon layer may be 300 Å~2500 Å thicker than the device isolation layer and the spacers may be formed of nitride. The sacrificial layer and the oxide layer may be formed of one selected from a group consisting of TEOS (tetraethyl orthosilicate) oxides, BPSG (borophosphosilicate glass), PSG (phosphosilicate glass), and HDP (high-density plasma) oxides. The oxide layer and the sacrificial layer may be removed by a chemical mechanical polishing (CMP) process or an etch back process. The spacers and the remaining sacrificial layer may be removed by an wet etching process using phosphoric acid at a temperature higher than 70° C.

Although certain example methods are disclosed herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for manufacturing a flash memory device, the method comprising:

forming a tunnel oxide layer on a semiconductor substrate;

forming a floating gate on the tunnel oxide layer;

forming a source/drain region at both sides of the floating gate by implanting ions into the semiconductor substrate including the floating gate;

forming spacers on sidewalls of the floating gate;

depositing a sacrificial layer on the resulting substrate;

exposing some part of the substrate and the floating gate by removing some part of the sacrificial layer and the tunnel oxide layer;

forming a first trench on the exposed part of the substrate and a second trench on the exposed part of the floating gate;

depositing an oxide layer to fill the first and second trenches with the oxide layer;

removing the oxide layer and the sacrificial layer until the floating gate is exposed;

removing the spacers and the remaining sacrificial layer to form a floating gate with the second trench and a trench-type device isolation layer; and depositing a gate insulating layer and a second polysilicon layer for a control gate on the resulting substrate.

2. A method as defined by claim 1, wherein the first polysilicon layer is formed more thickly than the device isolation layer.

3. A method as defined by claim 2, wherein the first polysilicon layer is 300 Å~2500 Å thicker than the device isolation layer.

4. A method as defined by claim 1, wherein the spacers are formed of nitride.

5. A method as defined by claim 1, wherein the sacrificial layer is formed of one of TEOS oxides, BPSG, PSG, and HDP oxides.

6. A method as defined by claim 1, wherein the oxide layer is formed of one of TEOS oxides, BPSG, PSG, and HDP oxides.

7. A method as defined by claim 1, wherein the oxide layer and the sacrificial layer are removed through a CMP process or an etch back process until the floating gate is exposed.

8. A method as defined by claim 1, wherein the spacers and the remaining sacrificial layer is removed through a wet etching process using phosphoric acid at a temperature higher than 70° C.

* * * * *